(12) United States Patent
Sato

(10) Patent No.: US 12,245,376 B2
(45) Date of Patent: Mar. 4, 2025

(54) EMBEDDED PRINTED CIRCUIT BOARD

(71) Applicant: SHINKO ELECTRIC INDUSTRIES CO., LTD., Nagano (JP)

(72) Inventor: Seiji Sato, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 289 days.

(21) Appl. No.: 18/062,229

(22) Filed: Dec. 6, 2022

(65) Prior Publication Data

US 2023/0199967 A1 Jun. 22, 2023

(30) Foreign Application Priority Data

Dec. 20, 2021 (JP) ................... 2021-206374

(51) Int. Cl.
*H05K 1/18* (2006.01)

(52) U.S. Cl.
CPC ..... *H05K 1/185* (2013.01); *H05K 2201/0212* (2013.01); *H05K 2201/10674* (2013.01); *H05K 2201/10734* (2013.01); *H05K 2201/10977* (2013.01)

(58) Field of Classification Search
CPC ........... H05K 1/185; H05K 2201/0212; H05K 2201/10674; H05K 2201/10734; H05K 2201/10977
USPC ......................................................... 174/260
See application file for complete search history.

(56) References Cited

U.S. PATENT DOCUMENTS

2009/0008765 A1 1/2009 Yamano et al.
2020/0185326 A1 6/2020 Sato

FOREIGN PATENT DOCUMENTS

JP 2020-096018 6/2020
WO 2007/069606 6/2007

*Primary Examiner* — Tremesha W Burns
(74) *Attorney, Agent, or Firm* — IPUSA, PLLC

(57) ABSTRACT

An embedded printed circuit board includes a first substrate, a semiconductor chip mounted on the first substrate, a second substrate provided on the first substrate via the semiconductor chip so that the semiconductor chip is sandwiched between the first substrate and the second substrate, a first resin filled between the semiconductor chip and the first substrate and having a cladding portion covering a side surface of the semiconductor chip, and a second resin filled between the first substrate and the second substrate and encapsulating the semiconductor chip and the first resin. The first resin includes a protrusion protruding from the cladding portion toward the second substrate.

12 Claims, 15 Drawing Sheets

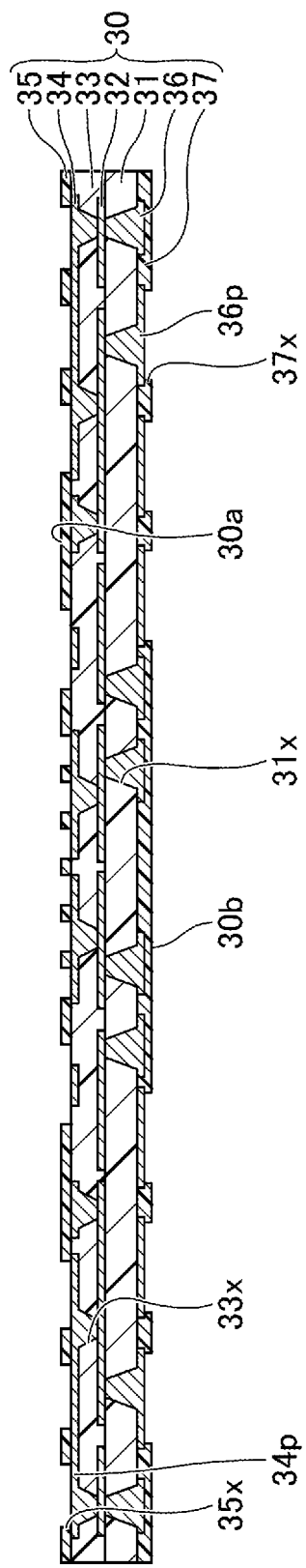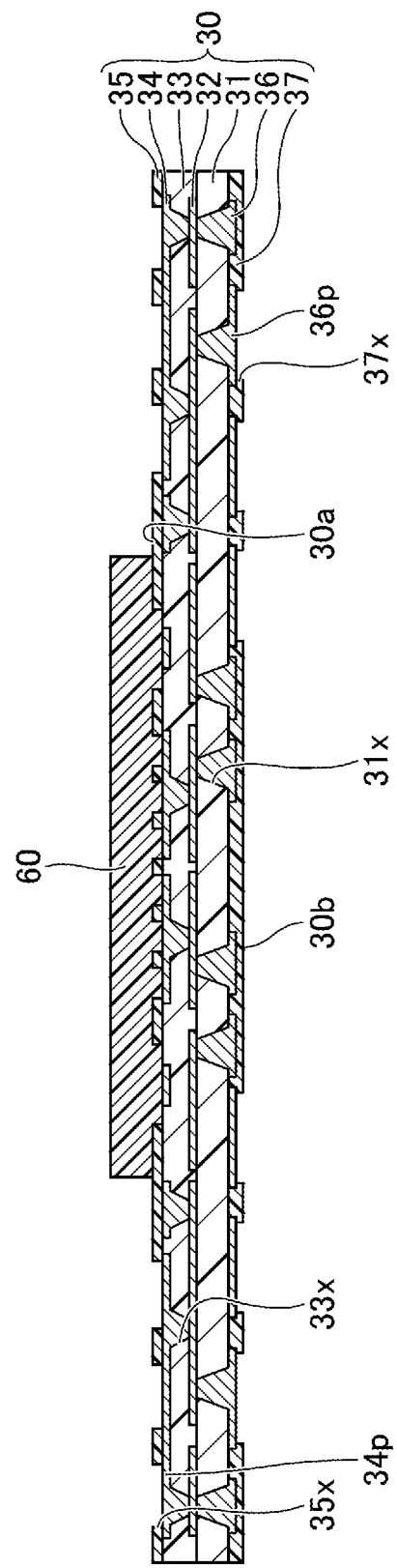

EMBEDDED PRINTED CIRCUIT BOARD

CROSS-REFERENCE TO RELATED APPLICATIONS

This application is based upon and claims priority to Japanese Patent Application No. 2021-206374, filed on Dec. 20, 2021, the entire contents of which are incorporated herein by reference.

FIELD

Certain aspects of the embodiments discussed herein are related to embedded printed circuit boards (PCBs) embedded with electronic components, and methods for manufacturing embedded PCBs. The embedded PCB is sometimes also referred to as an electronic component embedded substrate or board, an embedded PCB or board, an electronic component incorporating substrate or board, or the like.

BACKGROUND

In recent years, embedded PCBs embedded with semiconductor chips have been proposed for the purposes of reducing thickness, occupying space, or the like of the PCBs.

An example of the embedded PCB has a structure including a first substrate mounted with a semiconductor chip that is flip-chip bonded face-down, a second substrate laminated on the first substrate via a substrate bonding member, such as a solder ball or the like, and a resin sealing a gap between the first substrate and the second substrate.

A method for manufacturing the embedded PCB described above includes processes of forming the first substrate mounted with the semiconductor chip, forming the second substrate provided with the substrate bonding member, laminating the second substrate on the first substrate in a state where the substrate bonding member opposes a semiconductor chip mounting surface, and filling the resin between the first substrate and the second substrate, for example. When filling the resin, it is preferable to also fill the resin between a back surface of the semiconductor chip and the second substrate, from a viewpoint of securing reliability.

Japanese Laid-Open Patent Publication No. 2020-096018, and International Publication Pamphlet No. WO 2007/069606 propose examples of the embedded PCB.

However, in order to further reduce the thickness of the embedded PCB, the gap between the back surface of the semiconductor chip and the second substrate inevitably needs to be reduced. In addition, because the structure to be filled with the resin is pressed from above and below by a mold when filling the resin, the gap is further reduced, thereby making it is difficult to fill the resin between the back surface of the semiconductor chip and the second substrate.

SUMMARY

One object according to one aspect of embodiments of the present disclosure to provide an embedded printed circuit board and a method for manufacturing the embedded printed circuit board, which enable a resin to be easily filled between a back surface of a semiconductor chip and a substrate opposing the back surface.

According to one aspect of embodiments of the present disclosure, an embedded printed circuit board includes a first substrate; a semiconductor chip mounted on the first substrate; a second substrate provided on the first substrate via the semiconductor chip so that the semiconductor chip is sandwiched between the first substrate and the second substrate; a first resin filled between the semiconductor chip and the first substrate and having a cladding portion covering a side surface of the semiconductor chip; and a second resin filled between the first substrate and the second substrate and encapsulating the semiconductor chip and the first resin, wherein the first resin includes a protrusion protruding from the cladding portion toward the second substrate.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 3A and FIG. 3B are cross sectional views (part 1) illustrating examples of manufacturing processes of the embedded PCB according to the first embodiment;

DESCRIPTION OF EMBODIMENTS

Figure 1:
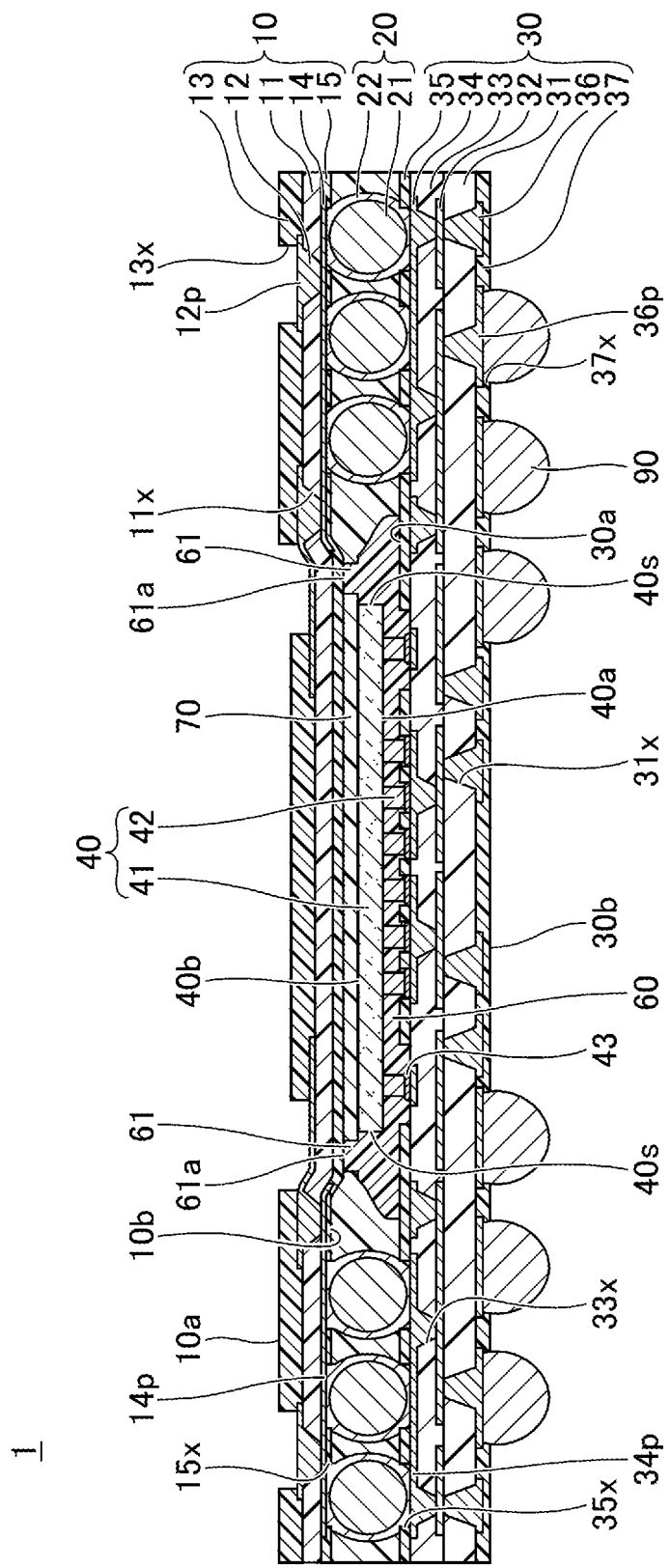
FIG. 1 is a cross sectional view illustrating an example of an embedded PCB according to a first embodiment.

Preferred embodiments of the present invention will be described with reference to the accompanying drawings. In the drawings, those constituent elements having substantially the same functional structures are designated by the same reference numerals, and a repeated description of such constituent elements may be omitted.

First Embodiment

A first embodiment will be described. The first embodiment relates to an embedded printed circuit board (PCB).
[Configuration of Embedded PCB]
First, a configuration of the embedded PCB will be described. FIG. 1 is a cross sectional view illustrating the configuration of the embedded PCB according to a first embodiment.

As illustrated in FIG. 1, an embedded PCB 1 according to the first embodiment includes a substrate 10, substrate bonding members 20, a substrate 30, a semiconductor chip 40, a conductive bonding material 43, an underfill resin 60, a mold resin 70, and an external connection terminal 90. In the embedded PCB 1, the substrate 10 and the substrate 30 are laminated via the substrate bonding members 20 that electrically connect the substrate 10 and the substrate 30. The substrate 30 is an example of a first substrate, and the substrate 10 is an example of a second substrate.

In the present embodiment, for the sake of convenience, the side of the embedded PCB 1 closer to the solder resist layer 13 may be referred to as an upper side or one side, and the side of the embedded PCB 1 closer to the solder resist layer 37 may be referred to as a lower side or the other side. In addition, a surface of each portion on the side of the embedded PCB 1 closer to the solder resist layer 13 may be referred to as one surface or an upper surface, and a surface of each portion on the side of the embedded PCB 1 closer to the solder resist layer 37 may be referred to as the other surface or a lower surface. However, the embedded PCB 1 may be used in an upside-down state, or in an inclined state inclined at an arbitrary angle. In addition, a plan view refers to a view of an object viewed from above the object in a normal direction to one surface of the solder resist layer 13, and a planar shape of the object refers to a shape of the object in the plan view viewed from above the object in the normal direction to the one surface of the solder resist layer 13.

The substrate 10 has one surface 10a, and the other surface 10b. The substrate 30 has one surface 30a, and the other surface 30b. The one surface 30a of the substrate 30 and the other surface 10b of the substrate 10 oppose each other.

The substrate 10 is disposed on the substrate 30 with the semiconductor chip 40 interposed therebetween. The substrate 10 includes an insulating layer 11, an interconnect layer 12, a solder resist layer 13, an interconnect layer 14, and a solder resist layer 15. A planar shape of the substrate 10 is not particularly limited, but may be a square shape having a side of 15 mm, for example.

In the substrate 10, a so-called glass epoxy substrate or the like having a glass cloth impregnated with an insulating resin, such as an epoxy-based resin or the like, can be used as the insulating layer 11, for example. A substrate or the like having a woven fabric or a nonwoven fabric of glass fiber, carbon fiber, aramid fiber, or the like impregnated with the insulating resin, such as the epoxy-based resin or the like, can also be used as the insulating layer 11, for example. A thickness of the insulating layer 11 may be in a range of approximately 60 μm to approximately 200 μm, for example. In each drawing, illustration of the glass cloth or the like is omitted.

The interconnect layer 12 is formed on one surface of the insulating layer 11. The interconnect layer 12 is electrically connected to the interconnect layer 14. The interconnect layer 12 includes a via interconnect filling a via hole 11x penetrating the insulating layer 11 and exposing one surface of the interconnect layer 14, and an interconnect pattern formed on the one surface of the insulating layer 11.

The via hole 11x may be a cavity having an inverted truncated cone shape, and a diameter of an opening of the cavity at one end which opens to the solder resist layer 13 is greater than a diameter of an opening of the cavity at the other end (that is, a bottom surface of the cavity) formed by an upper surface of the interconnect layer 14. A diameter of the opening of the via hole 11x, that opens at the one end to the resist layer 13, may be approximately 50 μm, for example. A material used for the interconnect layer 12 may be copper (Cu) or the like, for example. A thickness of the interconnect pattern forming the interconnect layer 12 may be in a range of approximately 10 μm to approximately 20 μm, for example.

The solder resist layer 13 is formed on the one surface of the insulating layer 11, so as to cover the interconnect layer 12. The solder resist layer 13 can be formed of a photosensitive resin or the like, for example. A thickness of the solder resist layer 13 may be in a range of approximately 15 μm to approximately 35 μm, for example. The solder resist layer 13 has openings 13x, and portions of the interconnect layer 12 are exposed inside the openings 13x. The interconnect layer 12 exposed inside the openings 13x includes pads 12p. The pads 12p function as pads to be electrically connected to an electronic component (not illustrated), such as a semiconductor chip, a semiconductor package, or the like.

A metal layer may be formed on one surface of the pad 12p, or the one surface of the pad 12p may be subjected to an anti-oxidation treatment, such as an organic solderability preservative (OSP) treatment or the like, as required. Examples of the metal layer include an Au layer, a Ni/Au layer (that is, a metal layer in which a Ni layer and a Au layer are laminated in this order), a Ni/Pd/Au layer (that is, a metal layer in which an Ni layer, a Pd layer, and a Au layer are laminated in this order), or the like. Further, an external connection terminal, such as a solder ball or the like, may be formed on one surface of the pad 12p.

The interconnect layer 14 is formed on the other surface of the insulating layer 11. The one surface of the interconnect layer 14 makes contact with and is electrically connected to a lower end portion of the via interconnect filling the via hole 11x of the interconnect layer 12. A material and a thickness of the interconnect layer 14 may be similar to those of the interconnect pattern forming the interconnect layer 12, for example.

The solder resist layer 15 is formed on the other surface of the insulating layer 11, so as to cover the interconnect layer 14. A material and a thickness of the solder resist layer 15 may be similar to those of the solder resist layer 13, for example. The solder resist layer 15 has openings 15x, and portions of the interconnect layer 14 are exposed inside the openings 15x. The interconnect layer 14 exposed inside the openings 15x includes pads 14p. The pads 14p function as pads to be electrically connected to the substrate bonding members 20.

The metal layer described above may be formed on the other surface of the pad 14p, or the other surface of the pad 14p may be subjected to an anti-oxidation treatment, such as the OSP treatment or the like, as required.

The substrate 30 includes an insulating layer 31, an interconnect layer 32, an insulating layer 33, an interconnect layer 34, a solder resist layer 35, an interconnect layer 36, and a solder resist layer 37. A planar shape of the substrate 30 is not particularly limited, but may be a square shape having a side of 15 mm, for example.

In the substrate 30, a material and a thickness of the insulating layer 31 may be similar to those of the insulating layer 11, for example. The interconnect layer 32 is formed on one surface of the insulating layer 31. A material and a thickness of the interconnect layer 32 may be similar to those of the interconnect pattern forming the interconnect layer 12, for example.

The insulating layer 33 is formed on one surface of the insulating layer 31 so as to cover the interconnect layer 32. A material used for the insulating layer 33 may be an insulating resin, such as a thermosetting epoxy-based resin or the like, for example. The insulating layer 33 may include a filler, such as silica ($SiO_2$) or the like. A thickness of the insulating layer 33 may be in a range of approximately 15 μm to approximately 35 μm, for example.

The interconnect layer 34 is formed on one surface of the insulating layer 33. The interconnect layer 34 includes a via interconnect filling a via hole 33x penetrating the insulating layer 33 and exposing one surface of the interconnect layer 32, and an interconnect pattern formed on the one surface of the insulating layer 33.

The via hole 33x may be a cavity having an inverted truncated cone shape, and a diameter of an opening of the cavity at one end which opens to the solder resist layer 35 is greater than a diameter of an opening of the cavity at the other end (that is, a bottom surface of the cavity) formed by an upper surface of the interconnect layer 32. A material used for the interconnect layer 34, and a thickness of the interconnect pattern forming the interconnect layer 34, may be similar to those of the interconnect layer 12, for example.

The solder resist layer 35 is formed on the one surface of the insulating layer 33, so as to cover the interconnect layer 34. A material and a thickness of the solder resist layer 35 may be similar to those of the solder resist layer 13, for example. The solder resist layer 35 has openings 35x, and portions of the interconnect layer 34 are exposed inside the openings 35x. The interconnect layer 34 exposed inside the openings 35x includes pads 34p.

A portion of the pads 34p functions as pads to be electrically connected to the substrate bonding members 20. Other portions of the pads 34p function as pads to be electrically connected to the semiconductor chip 40. The diameter of the pads 34p electrically connected to the substrate bonding members 20 and the diameter of the pads 34p electrically connected to the semiconductor chip 40 can be set independently.

The metal layer described above may be formed on one surface of the pad 34p, or the one surface of the pad 34p may be subjected to an anti-oxidation treatment, such as the OSP treatment or the like, as required.

The interconnect layer 36 is formed on the other surface of the insulating layer 31. The interconnect layer 36 includes a via interconnect filling a via hole 31x penetrating the insulating layer 31 and exposing the other surface of the interconnect layer 32, and an interconnect pattern formed on the other surface of the insulating layer 31.

The via hole 31x may be a cavity having a truncated cone shape, and a diameter of an opening of the cavity at one end which opens to the solder resist layer 37 is greater than a diameter of an opening of the cavity at the other end (that is, a bottom surface of the cavity) formed by a lower surface of the interconnect layer 32. An upper end portion of the via interconnect filling the via hole 31x of the interconnect layer 36 makes contact with and is electrically connected to the other surface of the interconnect layer 32. A material used for the interconnect layer 36, and a thickness of the interconnect pattern forming the interconnect layer 36, may be similar to those of the interconnect layer 12, for example.

The solder resist layer 37 is formed on the other surface of the insulating layer 31, so as to cover the interconnect layer 36. A material and a thickness of the solder resist layer 37 may be similar to those of the solder resist layer 13, for example. The solder resist layer 37 has openings 37x, and portions of the interconnect layer 36 are exposed inside the openings 37x. The interconnect layer 36 exposed inside the openings 37x includes pads 36p.

The metal layer described above may be formed on the other surface of the pad 36p, or the other surface of the pad 36p may be subjected to an anti-oxidation treatment, such as the OSP treatment or the like, as required.

The semiconductor chip 40 is flip-chip bonded face-down (that is, in a state where a circuit forming surface 40a opposes the one surface of the substrate 30) on one surface 30a of the substrate 30. More specifically, the semiconductor chip 40 includes a chip body 41 provided with a semiconductor integrated circuit, and protruding electrodes 42 that are connection terminals, and the protruding electrodes 42 of the semiconductor chip 40 are electrically connected to the pads 34p of the substrate 30 via the conductive bonding material 43. A gold bump, a copper post, or the like can be used for the protruding electrodes 42, for example. A solder material, such as an alloy containing Pb, an alloy of Sn and Cu, an alloy of Sn and Sb, an alloy of Sn and Ag, or an alloy of Sn, Ag, and Cu, or the like can be used for the conductive bonding material 43, for example.

The underfill resin 60 is filled between the circuit forming surface 40a of the semiconductor chip 40, and the one surface 30a of the substrate 30. The underfill resin 60 also extends to each side surface 40s of the semiconductor chip 40. A back surface 40b of the semiconductor chip 40 is exposed from the underfill resin 60. The underfill resin 60 is an example of a first resin.

In other words, the circuit forming surface 40a and the side surfaces 40s of the semiconductor chip 40 are continuously covered with the underfill resin 60. That is, the underfill resin 60 has cladding portions that cover the side surfaces 40s. An insulating resin, such as a thermosetting epoxy-based resin or the like, can be used for the underfill resin 60, for example. The underfill resins 60 may include a filler, such as silica ($SiO_2$) or the like. A planar shape of the semiconductor chip 40 is not particularly limited, but may be a square shape having a side of 12 mm, for example.

The underfill resin 60 further includes protrusions 61 protruding from the portions (or cladding portions) that extend to the side surfaces 40s of the semiconductor chip 40, toward the other surface 10b of the substrate 10. The protrusions 61 have a top portion 61a located closer to the other surface 10b of the substrate 10 than to the back surface 40b of the semiconductor chip 40. A height H (that is, a protruding amount from the back surface 40b of the semiconductor chip 40) of the protrusions 61 may be in a range of approximately 15 μm to approximately 20 μm, for example. That is, the height from the one surface 30a of the substrate 30 to the top portion 61a of the protrusion 61 is higher than a height from the one surface 30a of the substrate 30 to the back surface 40b of the semiconductor chip 40.

Figure 2:
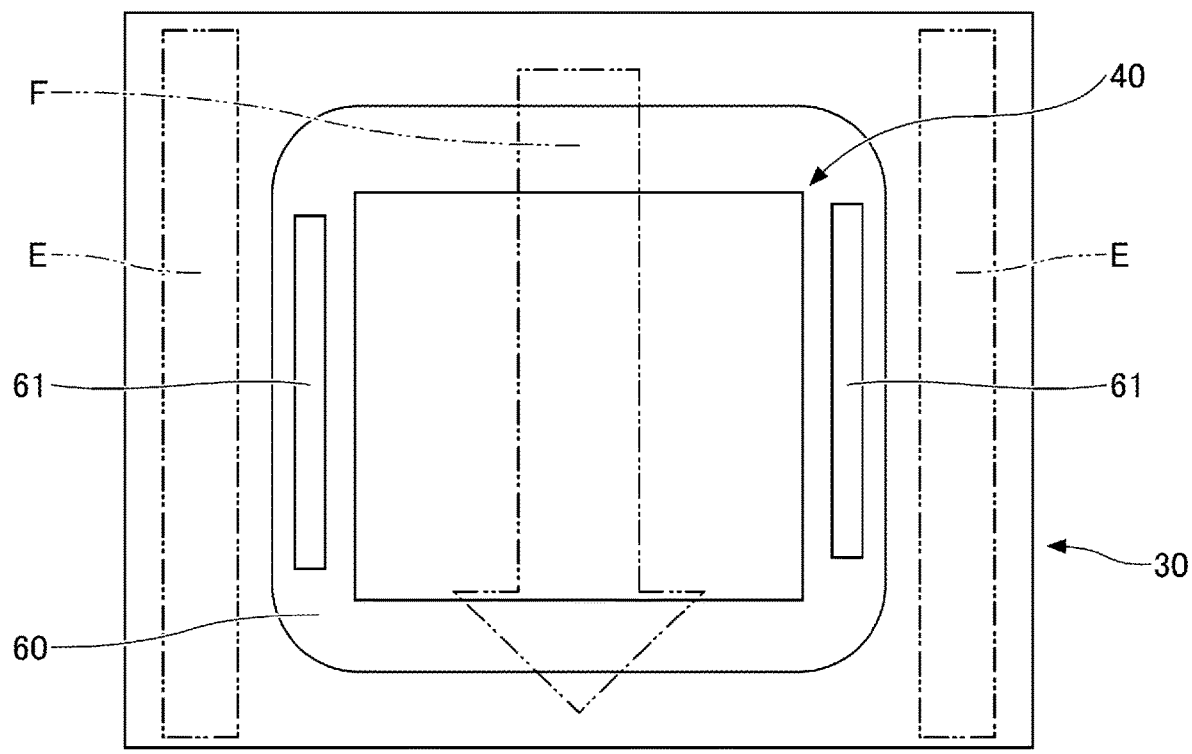
FIG. 2 is a plan view schematically illustrating an arrangement of protrusions in the first embodiment.

As illustrated in FIG. 2, for example, the protrusions 61 are provided on the outer sides the two mutually parallel side surfaces 40s of the semiconductor chip 40, and extend linearly in parallel to the two side surfaces 40s, respectively. A width W of the protrusion 61 may be in a range of approximately 250 μm to approximately 350 μm, for example, on the same plane as the back surface 40b of the semiconductor chip 40.

FIG. 2 is a plan view schematically illustrating an arrangement of the protrusions in the first embodiment, and schematically illustrates only some of the constituent elements of the embedded PCB 1. FIG. 2 is not drawn to scale with respect to the dimensional relationships of FIG. 1. Further, regions E in FIG. 2 indicate regions where the substrate bonding members 20 are disposed. An arrow F in FIG. 2 indicates an example of a flow direction of the mold resin during manufacturing processes of the embedded PCB 1.

The substrate bonding members 20 are disposed between the pads 14p of the substrate 10 and the pads 34p of the substrate 30. The substrate bonding members 20 have functions of electrically connecting the substrate 10 and the substrate 30, and securing a predetermined gap between the substrate 10 and the substrate 30.

In the present embodiment, as an example, solder balls with a core are used as the substrate bonding members 20. The substrate bonding member 20 includes an approximately spherical core 21, and a conductive material 22 that covers an outer peripheral surface of the core 21, and the core 21 is disposed so as to make contact with the pads 14p and 34p.

A metal core made of a metal such as copper, a resin core made of a resin, or the like can be used for the core 21, for example. A solder material, such as an alloy containing Pb, an alloy of Sn and Cu, an alloy of Sn and Sb, an alloy of Sn and Ag, an alloy of Sn, Ag, and Cu, or the like can be used for the conductive material 22, for example. A diameter of the core 21 can be determined appropriately by taking into consideration the height (or thickness) of the semiconductor chip 40. The diameter of the core 21 may be approximately 160 μm, a thickness of the conductive material 22 may be approximately 20 μm, and a total diameter of the substrate bonding member 20 may be approximately 200 μm, for example.

In FIG. 1, the substrate bonding members 20 are disposed in three rows (or columns) on both the right and left sides of the semiconductor chip 40. However, the substrate bonding members 20 may be disposed in two rows or four or more rows on both the right and left sides of the semiconductor chip 40. In addition, the substrate bonding members 20 may be disposed in a peripheral shape along a peripheral edge of the substrate 10. In a case where the diameter of the substrate bonding members 20 is approximately 200 μm, for example, a pitch of the substrate bonding members 20 may be approximately 270 μm, for example.

The substrate 10 does not need to have a flat shape as a whole, and as illustrated in FIG. 1, for example, in an overlapping portion of the substrate 10 overlapping the semiconductor chip 40 in the plan view, the substrate 10 may be curved (or bent) toward the substrate 30, from a periphery of the overlapping portion the semiconductor chip 40 on an inner side where the substrate bonding members 20 are connected. In this case, the top portion 61a of each of the protrusions 61 and the other surface 10b of the substrate 10 may make direct contact with each other. Although a curved amount of (or an amount of the bend in) the substrate 10 is small, the curved (or bent) substrate 10 is illustrated in an exaggerated manner in FIG. 1 or the like for the sake of convenience. Even in the case where the substrate 10 is curved, because the curved amount of the substrate 10 is small, the curved substrate 10 does not interfere with the mounting electronic components, such as the semiconductor chip, the semiconductor package, or the like onto the pads 12p.

The mold resin 70 encapsulates the substrate bonding members 20, the semiconductor chip 40, and the underfill resin 60, and is filled between the other surface 10b of the substrate 10 and the one surface 30a of the substrate 30. An insulating resin, such as a thermosetting epoxy-based resin or the like including a filler, can be used for the mold resin 70, for example. The mold resin 70 is also filled between the back surface 40b of the semiconductor chip 40 and the other surface 30b of the substrate 30. The mold resin 70 is an example of a second resin.

The external connection terminals 90 are provided on the other surface of the pads 36p, and protrude downward from the other surface of the solder resist layer 37 through the openings 37x. The external connection terminals 90 are formed of solder bumps, for example. Each external connection terminals 90 may include a post, and a bump disposed thereon. The external connection terminals 90 function as external connection terminals to be electrically connected to a mounting substrate (not illustrated) or the like, such as a motherboard or the like, for example.

[Method for Manufacturing Embedded PCB According to First Embodiment]

Next, a method for manufacturing the embedded PCB according to the first embodiment will be described. FIG. 3A through FIG. 9 are cross sectional views illustrating examples of manufacturing processes of the embedded PCB according to the first embodiment. Each manufacturing process (or step) will be described by illustrating only the portion that becomes the embedded PCB, but in actual practice, a plurality of portions that become embedded PCBs are manufactured on a substrate, and a plurality of embedded PCBs are manufactured by singulating the substrate into individual embedded PCBs.

First, as illustrated in FIG. 3A, the substrate 30 is manufactured. More particularly, the insulating layer 31 using a so-called glass epoxy substrate or the like described above is prepared, and the interconnect layer 32 is formed on the one surface of the insulating layer 31. Next, the via hole 31x that exposes the other surface of the interconnect layer 32 is formed in the insulating layer 31, and further, the interconnect layer 36 is formed on the other surface of the insulating layer 31. The interconnect layer 32 and the interconnect layer 36 are electrically connected to each other through the via interconnect inside the via hole 31x.

After forming the via hole 31x, a desmear process is preferably performed to remove a resin residue adhered to the surface of the interconnect layer 32 exposed at the bottom of the via hole 31x. The via hole 31x can be formed by a laser beam machining using a $CO_2$ laser or the like, for example. The interconnect layers 32 and 36 can be formed using various interconnect forming methods, such as a semi-additive method, a subtractive method, or the like. The interconnect layers 32 and 36 can be formed by copper plating or the like, for example.

Next, an insulating resin film, such as a thermosetting epoxy-based resin or the like, is laminated on the one surface of the insulating layer 31, so as to cover the interconnect layer 32, to thereby form the insulating layer 33. Alternatively, instead of laminating the insulating resin film, such as the thermosetting epoxy-based resin or the like, a liquid or paste of the insulating resin, such as the thermosetting epoxy-based resin or the like, may be coated on the one surface of the insulating layer 31, and thereafter cured, to thereby form the insulating layer 33.

Next, the via hole 33x, that penetrates the insulating layer 33 and exposes the one surface of the interconnect layer 32, is formed in the insulating layer 33. The via hole 33x can be formed by the laser beam machining using the $CO_2$ laser or the like, for example. After forming the via hole 33x, a desmear process is preferably performed to remove a resin residue adhered to the surface of the interconnect layer 32 exposed at the bottom of the via hole 33x.

Next, the interconnect layer 34 is formed on the one surface of the insulating layer 33. The interconnect layer 34 includes the via interconnect filling the via hole 33x, and the interconnect pattern formed on the one surface of the insulating layer 33. The interconnect layer 34 is electrically connected to the interconnect layer 32 exposed at the bottom of the via hole 33x. The interconnect layer 34 can be formed using various interconnect forming methods, such as the semi-additive method, the subtractive method, or the like.

Next, the solder resist layer 35 is formed on the one surface of the insulating layer 33, so as to cover the interconnect layer 34, and the solder resist layer 37 is formed on the other surface of the insulating layer 31, so as to cover the interconnect layer 36. The solder resist layer 35 can be formed by coating a liquid or paste of an insulating resin, such as the photosensitive epoxy-based resin or the like, on the one surface of the insulating layer 33, by a screen printing method, a roll coating method, a spin coating method, or the like, for example, so as to cover the interconnect layer 34. Alternatively, instead of coating the liquid or paste of the insulating resin, an insulating resin, such as a photosensitive epoxy-based resin film or the like, for example, may be laminated on the one surface of the insulating layer 33.

Similarly, the solder resist layer 37 can be formed by coating a liquid or paste of an insulating resin, such as the photosensitive epoxy-based resin or the like, on the other surface of the insulating layer 31, by a similar method, for example, so as to cover the interconnect layer 36. Alternatively, instead of coating the liquid or paste of the insulating resin, an insulating resin, such as a photosensitive epoxy-based resin film or the like, for example, may be laminated on the other surface of the insulating layer 31.

Then, by exposing and developing the coated or laminated insulating resins, the openings 35x and 37x are formed in the solder resist layers 35 and 37, respectively, and the pads 34p and 36p are formed by photolithography. Of course, the openings 35x and 37x may be formed by the laser beam machining or by blasting. Planar shapes of the openings 35x and 37x may be circular shapes, for example. Diameters of the openings 35x and 37x can be designed arbitrarily in accordance with the connection target. The substrate 30 is completed by the processes described above.

Next, as illustrated in FIG. 3B, the underfill resin 60 is bonded (or laminated) to the one surface of the substrate 30, so as to cover portions of the pads 34p of the substrate 30 to be connected to the semiconductor chip 40. An insulating resin, such as a thermosetting epoxy-based resin film or the like, can be used for the underfill resin 60, for example. At this state, the underfill resin 60 is a B-stage resin, that is, a resin in a semi-cured state. A liquid resin may be used as the underfill resin 60, in place of the resin film.

Figure 4:
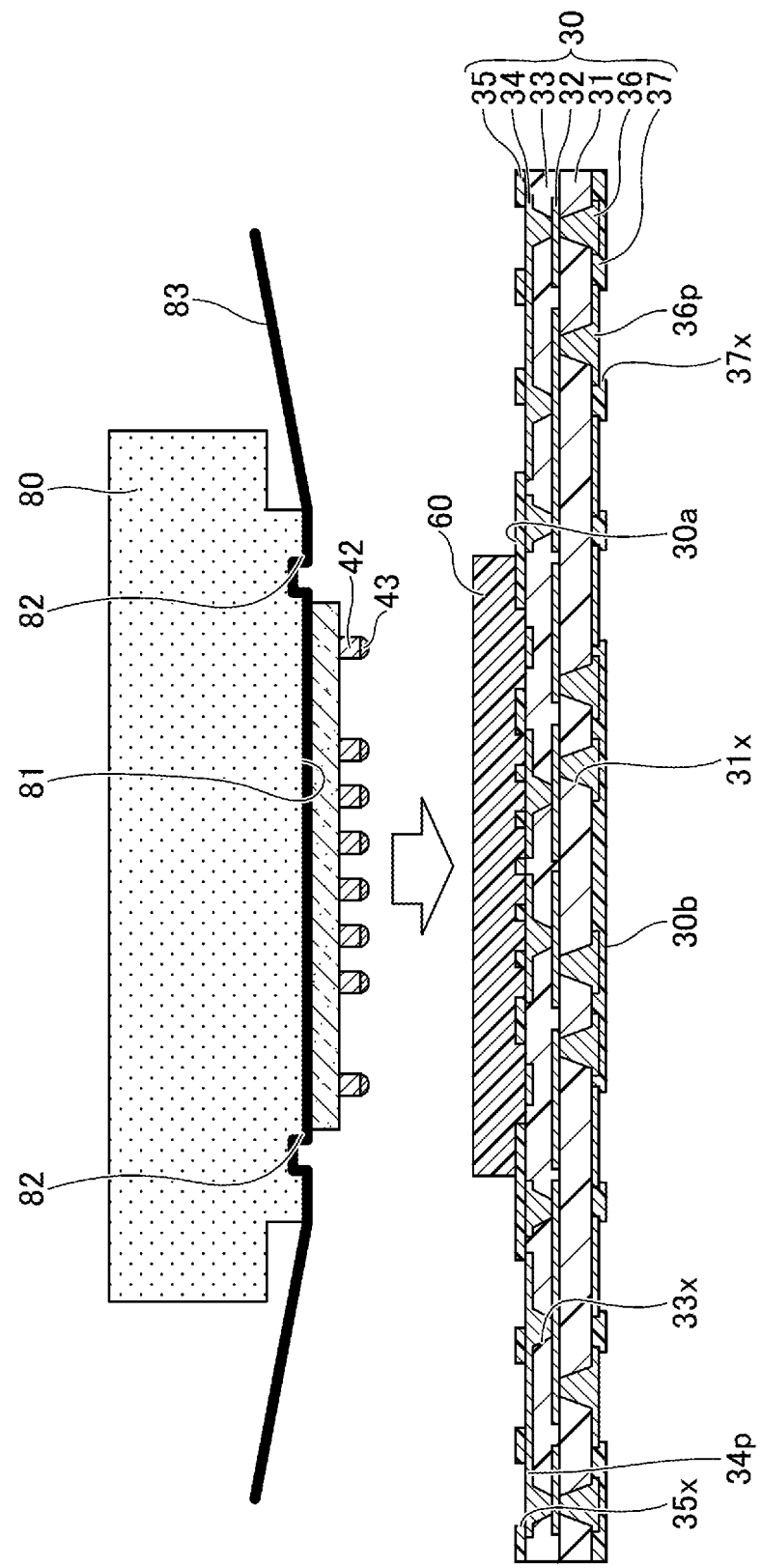
FIG. 4 is a cross sectional view (part 2) illustrating an example of a manufacturing process of the embedded PCB according to the first embodiment.

Next, as illustrated in FIG. 4, the semiconductor chip 40, having the protruding electrodes 42 formed on the circuit forming surface 40a of the chip body 41, is prepared. The conductive bonding material 43 is provided on tip ends of the protruding electrodes 42. Then, the semiconductor chip 40 is set on a bonding tool 80. As described above, the solder material, such as the alloy containing Pb, the alloy of Sn and Cu, the alloy of Sn and Sb, the alloy of Sn and Ag, the an alloy of Sn, Ag, and Cu, or the like can be used for the conductive bonding material 43, for example.

The bonding tool 80 includes a central portion where the semiconductor chip 40 is set under suction, and recesses formed at peripheral edges of the bonding tool 80. The recesses communicating with suction hole (not illustrated) are formed in a surface 81 of the bonding tool 80 opposing the back surface of the semiconductor chip 40. In this example, grooves 82 are formed as the recesses. The grooves 82 are formed in correspondence with regions where the protrusions 61 of the underfill resin 60 are to be formed, at the peripheral edges of the bonding tool 80. That is, the grooves 82 are formed linearly in the plan view. A depth of the grooves 82 is in a range of approximately 150 μm to approximately 250 μm, for example, and a width of the grooves 82 is in a range of approximately 300 μm to approximately 400 μm, for example. The surface 81 of the bonding tool 80 is covered by a film 83, such as a fluororesin film or the like, and the semiconductor chip 40 is set at the central portion on the bonding tool 80 in a state where the film 83 makes intimate contact with the surface 81 through the suction holes and the grooves 82.

Figure 5:
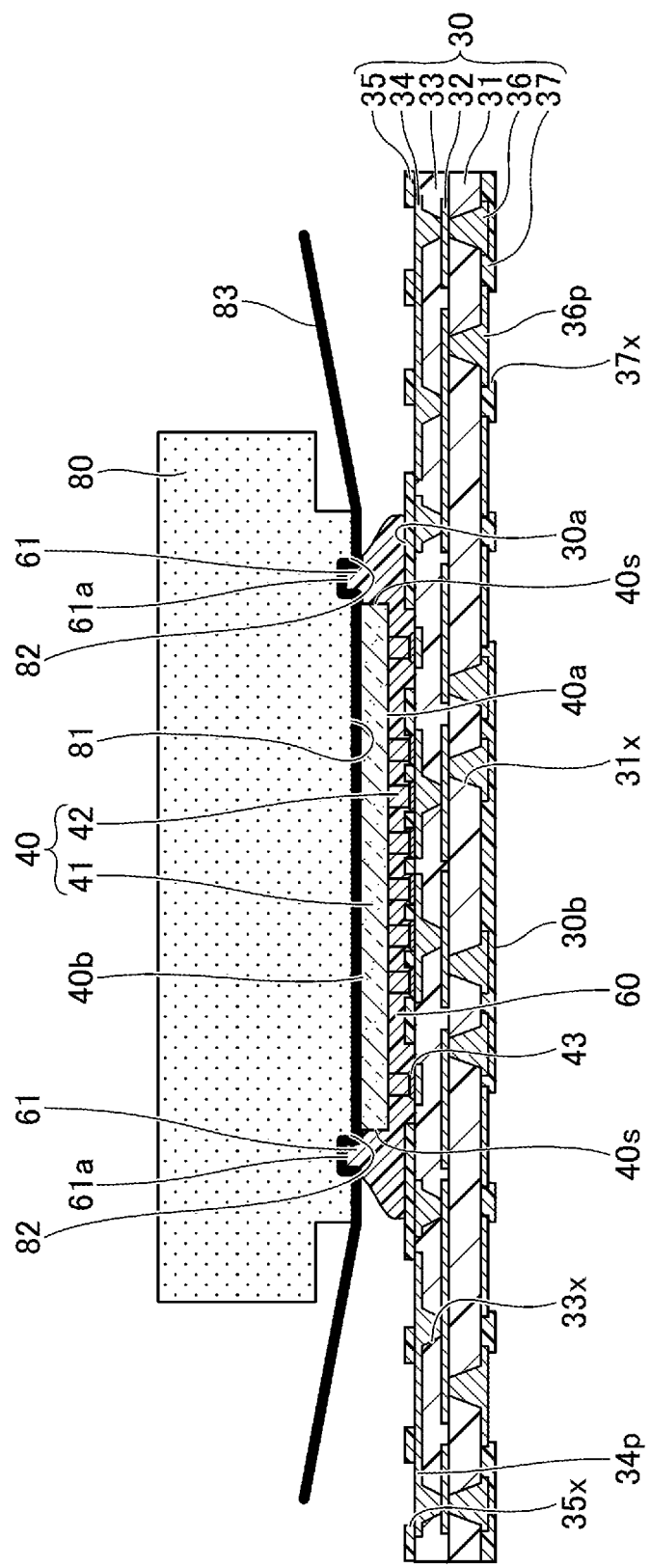
FIG. 5 is a cross sectional view (part 3) illustrating an example of a manufacturing process of the embedded PCB according to the first embodiment.

Next, as illustrated in FIG. 5, in a state where the conductive bonding material 43 and the underfill resin 60 are heated to a predetermined temperature of approximately 250° C., for example, a pressure is applied from above the underfill resin 60 until the conductive bonding material 43 on the tip ends of the protruding electrodes 42 makes contact with the one surface of the pads 34p. Because the underfill resin 60 in the semi-cured state has fluidity, a portion of the underfill resin 60 creeps up to the side surfaces 40s of the semiconductor chip 40 and enters the grooves 82. In other words, peripheral edges of the underfill resin 60 are pressed by the peripheral edges of the bonding tool 80, and the underfill resin 60 is pushed into the grooves 82, thereby forming the protrusions 61 and the cladding portions.

Figure 6A:
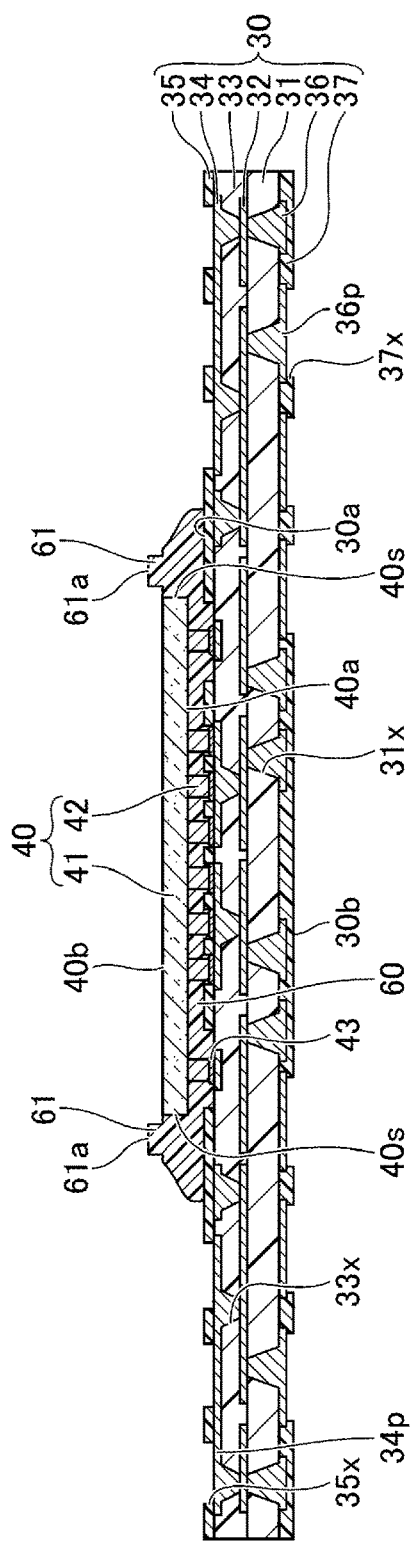
FIG. 6A, FIG. 6B, and FIG. 6C are cross sectional views (part 4) illustrating examples of manufacturing processes of the embedded PCB according to the first embodiment.

After the conductive bonding material 43 and the underfill resin 60 are cured by cooling, the bonding tool 80 and the film 83 are removed from the semiconductor chip 40, as illustrated in FIG. 6A. The protruding electrodes 42 of the semiconductor chip 40 are electrically connected to the pads 34p of the substrate 30, via the conductive bonding material 43. In addition, the underfill resin 60 is filled between the circuit forming surface 40a of the semiconductor chip 40 and the one surface 30a of the substrate 30, and the underfill resin 60 also extends to the side surfaces 40s of the semiconductor chip 40. Further, the underfill resin 60 has the protrusions 61 protruding upward from the portions (or cladding portions) that extend to the side surfaces 40s of the semiconductor chip 40, and the protrusions 61 have the top portions 61a located at positions above the back surface 40b of the semiconductor chip 40. In other words, the underfill resin 60 is molded so as to expose the back surface 40b of the semiconductor chip 40, cover the circuit forming surface 40a and the side surfaces 40s, and have the protrusions 61. The back surface 40b of the semiconductor chip 40, and an upper surface of the portions of the underfill resin 60 covering the side surfaces 40s of the semiconductor chip 40, excluding the protrusions 61, may coincide, for example.

In this manner, the semiconductor chip 40 can be flip-chip bonded face-down on the one surface 30a of the substrate 30.

The height H of the protrusions 61 is set such that a gap is formed between the top portions 61a of the protrusions 61 and the other surface 10b of the substrate 10, when the substrate 10 provided with the substrate bonding members 20 is laminated on the substrate 30, as will be described later and described in conjunction with FIG. 7A. This setting enables the substrate 10 and the substrate 30 to be more positively bonded via the substrate bonding members 20. The height H of the protrusions 61 may be set to such an extent that the top portion 61a of each of the protrusions 61 and the other surface 10b of the substrate 10 make contact with each other, when this setting does not interfere with the bonding between the substrate 10 and the substrate 30.

Figure 6B:
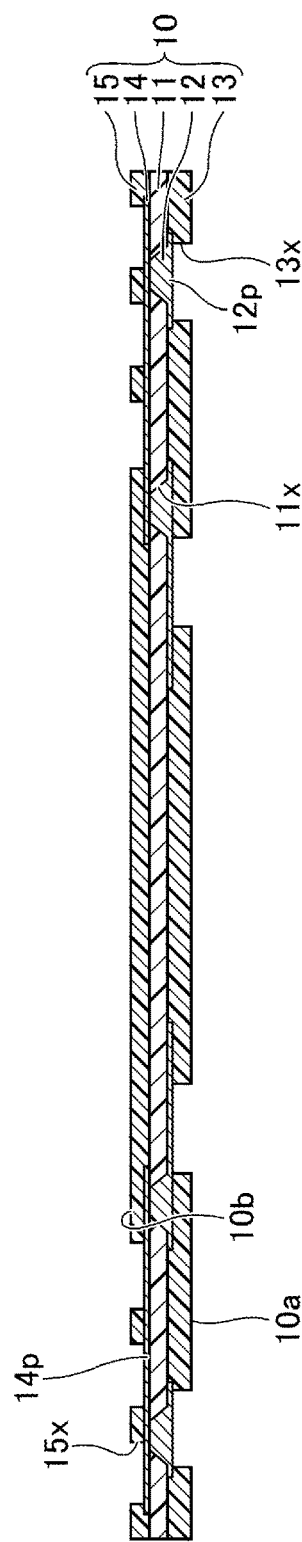

As illustrated in FIG. 6B, the substrate 10 is manufactured separately from the manufacture of the substrate 30 and the flip-chip bonding of the semiconductor chip 40. More particularly, the insulating layer 11 using the so-called glass epoxy substrate or the like as described above is prepared, and the interconnect layer 14 is formed on the other surface of the insulating layer 11. Next, the via hole 11x exposing the one surface of the interconnect layer 14 is formed in the insulating layer 11, and further, the interconnect layer 12 is formed on the one surface of the insulating layer 11. The interconnect layer 12 and the interconnect layer 14 are electrically connected to each other through the via interconnect inside the via hole 11x.

After forming the via hole 11x, a desmear process is preferably performed to remove a resin residue adhered to the surface of the interconnect layer 14 exposed at the bottom of the via hole 11x. The via hole 11x can be formed by a laser beam machining using a $CO_2$ laser or the like, for example. The interconnect layers 12 and 14 can be formed using various interconnect forming methods, such as the semi-additive method, the subtractive method, or the like. The interconnect layers 12 and 14 can be formed by copper plating or the like, for example.

Next, similar to the solder resist layer 35 or the like of the substrate 30, the solder resist layer 13 is formed on the one surface of the insulating layer 11, so as to cover the interconnect layer 12, and the solder resist layer 15 is formed on the other surface of the insulating layer 11, so as to cover the interconnect layer 14. Then, similar to the opening 35x or the like of the substrate 30, the openings 13x and 15x are formed in the solder resist layers 13 and 15, respectively, and the pads 12p and 14p are formed by photolithography. Thus, the substrate 10 is completed by the processes described above.

Figure 6C:
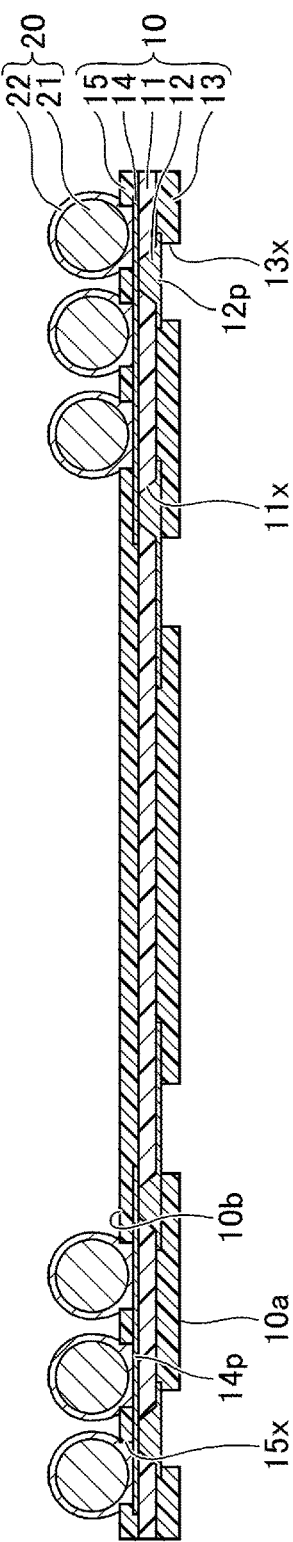

Next, as illustrated in FIG. 6C, the substrate bonding members 20 are set on the pads 14p exposed inside the openings 15x of the solder resist layer 15 of the substrate 10. Then, the substrate bonding members 20 are heated to a predetermined temperature to melt the conductive material 22 forming the substrate bonding members 20, and the conductive material 22 is thereafter cured so as to be bonded to the pads 14p.

Figure 7A:
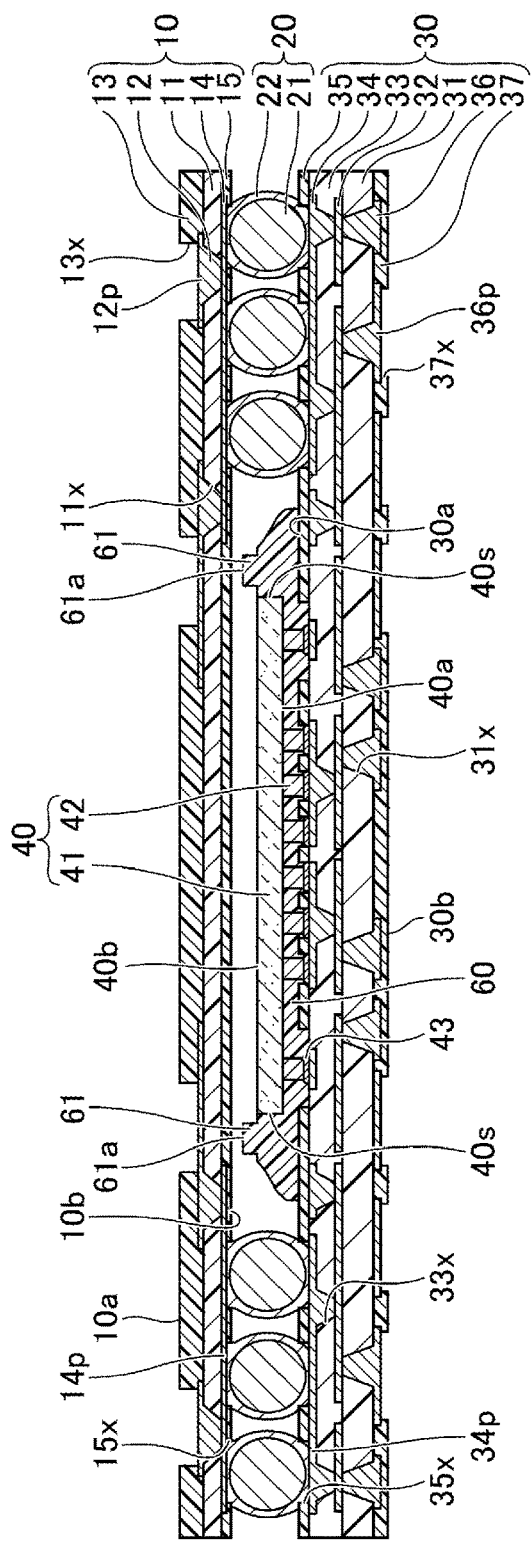
FIG. 7A and FIG. 7B are cross sectional views (part 5) illustrating examples of manufacturing processes of the embedded PCB according to the first embodiment.

Next, as illustrated in FIG. 7A, the substrate 10 mounted with the substrate bonding members 20 is turned upside-down from the state illustrated in FIG. 6C, and is laminated on the substrate 30 so that the conductive material 22 of the substrate bonding members 20 mounted on the substrate 10 makes contact with one the surface of the pads 34p.

Then, the substrate 10 is pressed toward the substrate 30, while the conductive material 22 is heated and melted. Accordingly, the substrate bonding members 20 make contact with the pads 14p of the substrate 10 and the pads 34p of the substrate 30, and the substrate 10 and the substrate 30 are electrically connected to each other via the substrate bonding members 20. Further, the core 21 of the substrate bonding members 20 secures a predetermined gap between the substrate 10 and the substrate 30.

Figure 7B:
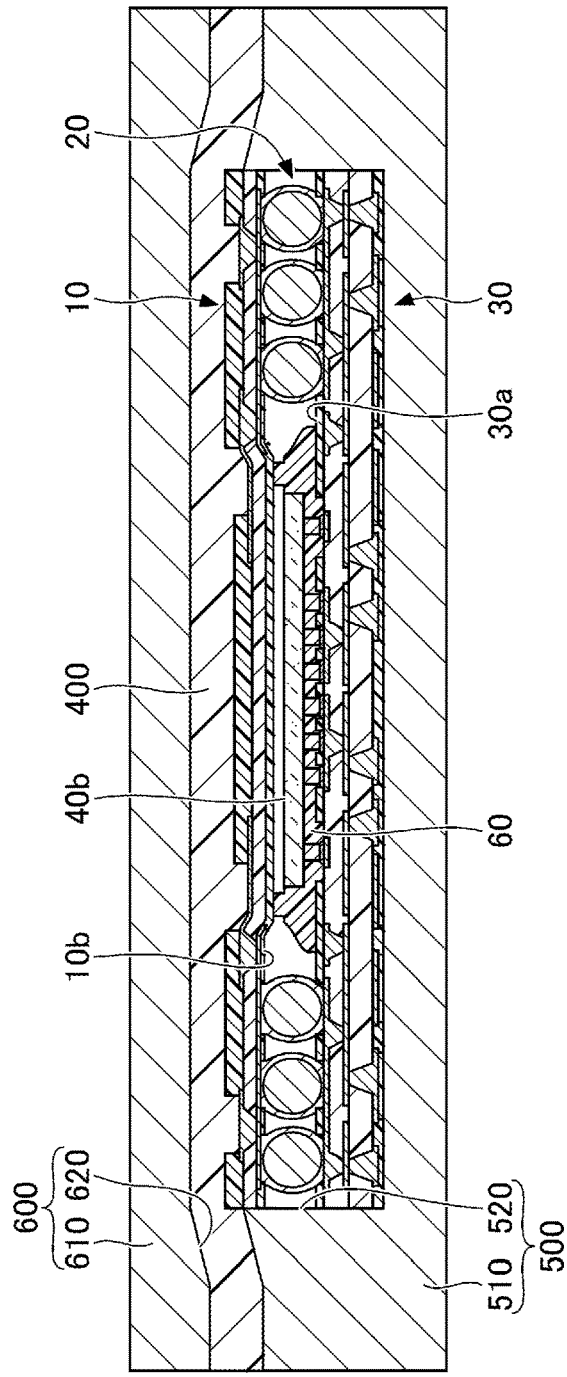

Next, as illustrated in FIG. 7B, the structure illustrated in FIG. 7A is sandwiched between a lower mold 500 and an upper mold 600. The lower mold 500 includes a frame portion 510 and a cavity portion 520. On the other hand, the upper mold 600 includes a frame portion 610 and a cavity portion 620. In the state where the structure illustrated in FIG. 7A is held between the lower mold 500 and the upper mold 600, the lower surface of the solder resist layer 37 makes contact with a bottom surface of the cavity portion 520, and the upper surface of the solder resist layer 13 makes contact with a bottom surface of the cavity portion 620 via a release film 400.

By providing the release film 400 on an inner wall of the cavity portion 620, it is possible to prevent the mold resin 70 from making direct contact with the inner wall of the cavity portion 620. A release film, that has a sufficiently high heat resistance to withstand a heating temperature of the mold resin 70, and is easily removable from the inner wall of the cavity portion 620, can be used for the release film 400. In addition, the release film 400 preferably has flexibility and extensibility that enable the release film 400 to be easily deformed in the shape of the inner wall of the cavity portion 620. More particularly, films of polytetrafluoroethylene (PTFE), ethylene tetrafluoro-ethylene (ETFE), polyethylene terephthalate (PET), and fluorinated ethylene propylene (FEP), fluorine impregnated glass cloths, polypropylene films, polyvinylidine chloride films, or the like can be used for the release film 400, for example.

The release film 400 may also be provided on an inner wall of the cavity portion 520. Further, instead of providing the release film 400 on the inner wall of the cavity portion 620, the release film 400 may be provided on the inner wall of the cavity portion 520.

As illustrated in FIG. 7B, because the structure illustrated in FIG. 7A is sandwiched between the lower mold 500 and the upper mold 600, the substrate 10 is pressed and bent, and the other surface 10b of the substrate 10 makes contact with the top portions 61a of the protrusions 61. Between two protrusions 61, a distance between the back surface 40b of the semiconductor chip 40 and the other surface 10b of the substrate 10 becomes equal to the height H of the protrusions 61. The distance between the back surface 40b of the semiconductor chip 40 and the other surface 10b of the substrate 10 may be in a range of approximately 15 µm to approximately 20 µm, for example.

Figure 8A:
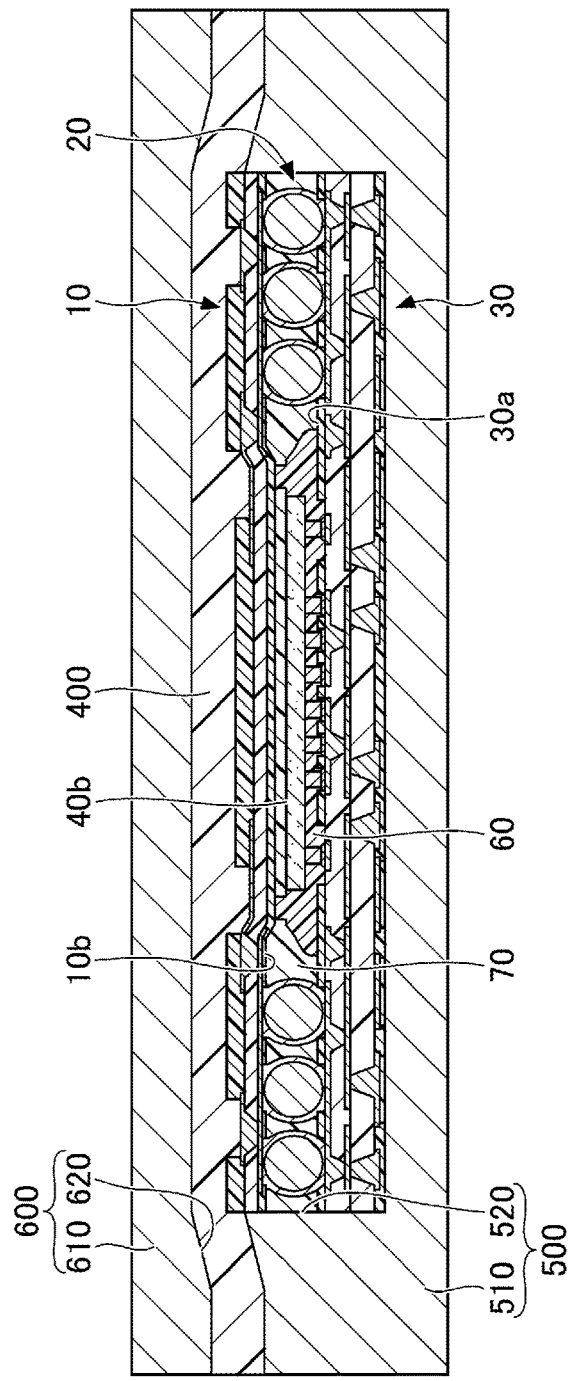
FIG. 8A and FIG. 8B are cross sectional views (part 6) illustrating examples of manufacturing processes of the embedded PCB according to the first embodiment.

Next, as illustrated in FIG. 8A, a liquid insulating resin, that becomes the mold resin 70, is injected into the cavity portions 520 and 620 from a resin injection port (not illustrated), to fill the cavity portions 520 and 620 with the liquid insulating resin that is thereafter cured. Thus, the mold resin 70 is formed between the substrate 10 and the substrate 30, to thereby encapsulate the substrate bonding members 20, the semiconductor chip 40, and the underfill resin 60. An insulating resin, such as a thermosetting epoxy-based resin or the like containing a filler, can be used for the mold resin 70, for example. The liquid insulating resin is injected so as to flow in a direction parallel to the direction in which the protrusions 61 extend in FIG. 2.

Figure 8B:
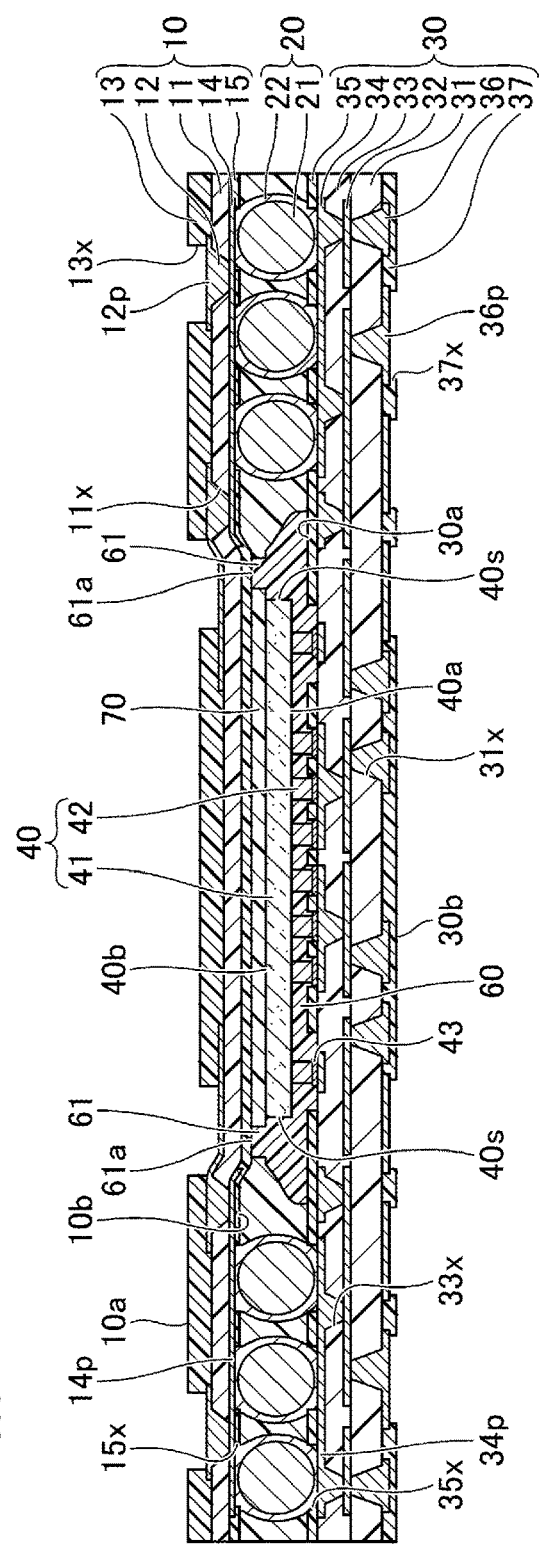

Next, as illustrated in FIG. 8B, the structure illustrated in FIG. 8A is removed from a sealed mold made up of the lower mold 500 and the upper mold 600.

As described above, the mold resin 70 can be formed by transfer molding using the sealed mold, for example.

As described above, in actual practice, a plurality of portions that become embedded PCBs are manufactured on a substrate, and a plurality of embedded PCBs are manufactured by singulating the substrate into individual embedded PCBs. That is, in the process illustrated in FIG. 8A, the mold resin 70 is simultaneously formed at the plurality of portions that become the embedded PCBs. After forming the mold resin 70, the plurality of portions are singulated into the individual embedded PCBs.

Figure 9:
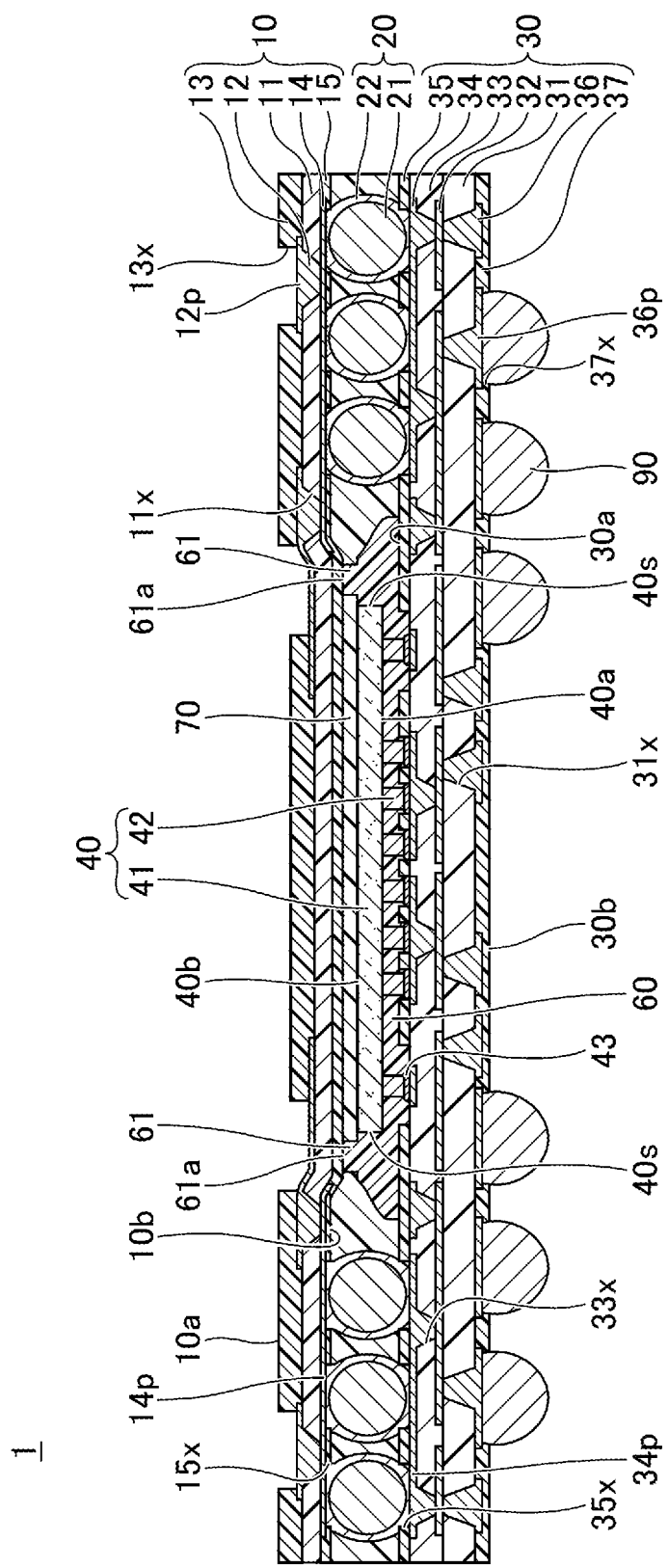
FIG. 9 is a cross sectional view (part 7) illustrating an example of a manufacturing process of the embedded PCB according to the first embodiment.

Next, as illustrated in FIG. 9, the external connection terminals 90, protruding downward from the other surface of the solder resist layer 37 through the openings 37x, are formed on the other surface of the pads 36p.

Hence, the embedded PCB 1 according to the first embodiment is completed by the processes described above.

As described above, in the embedded PCB 1 according to the first embodiment, the underfill resin 60 includes the protrusions 61 protruding from the portions (or cladding portions) that extend to the side surfaces 40s of the semiconductor chip 40, toward the other surface 10b of the substrate 10. The protrusions 61 have the top portions 61a located closer to the other surface 10b of the substrate 10 than to the back surface 40b of the semiconductor chip 40. For this reason, when forming the mold resin 70 (refer to FIG. 8A), even if a pressure is applied from above and below the structure illustrated in FIG. 7B filled with the mold resin 70, the gap can be secured between the back surface 40b of the semiconductor chip 40 and the other surface 10b of the substrate 10.

As a result, it is possible to improve an injection ease of the mold resin 70 into the region where the back surface 40b of the semiconductor chip 40 and the other surface 10b of the substrate 10 oppose each other. As a result, the region where the back surface 40b of the semiconductor chip 40 and the other surface 10b of the substrate 10 oppose each other can be positively filled with the mold resin 70.

In addition, because the region where the back surface 40b of the semiconductor chip 40 and the other surface 10b of the substrate 10 oppose each other can be positively filled with the mold resin 70, a design value of the gap between the back surface 40b of the semiconductor chip 40 and the other surface 10b of the substrate 10 can be made small. Thus, the total height of the embedded PCB 1 can be reduced.

Particularly, in a case where the gap between the top portions 61a of the protrusions 61 and the other surface 10b of the substrate 10 is filled with the mold resin 70, the protrusions 61 and the substrate 10 are bonded to each other. For this reason, even in a case where the embedded PCB 1 is used under a condition in which a high-temperature environment and a low-temperature environment are repeated, for example, it is possible to prevent vicinities of the protrusions 61 from becoming starting points of stripping.

In the process illustrated in FIG. 8A, a force acts between the substrate 10 and the substrate 30, in a direction in which the substrates 10 and 30 are pushed apart from each other due to an injection pressure of the insulating resin. For this reason, depending on the height of the protrusions 61 and a magnitude of the injection pressure of the insulating resin, a gap is generated between the top portions 61a of the protrusions 61 and the other surface 10b of the substrate 10, and the gap is also filled with the mold resin 70. In addition, in a case where the release film 400 is provided on the inner wall of at least one of the cavity portions 520 and 620, the gap may be generated between the top portions 61a of the protrusion 61s and the other surface 10b of the substrate 10 also due to deformation (shrinkage) of the release film 400.

Figure 10:
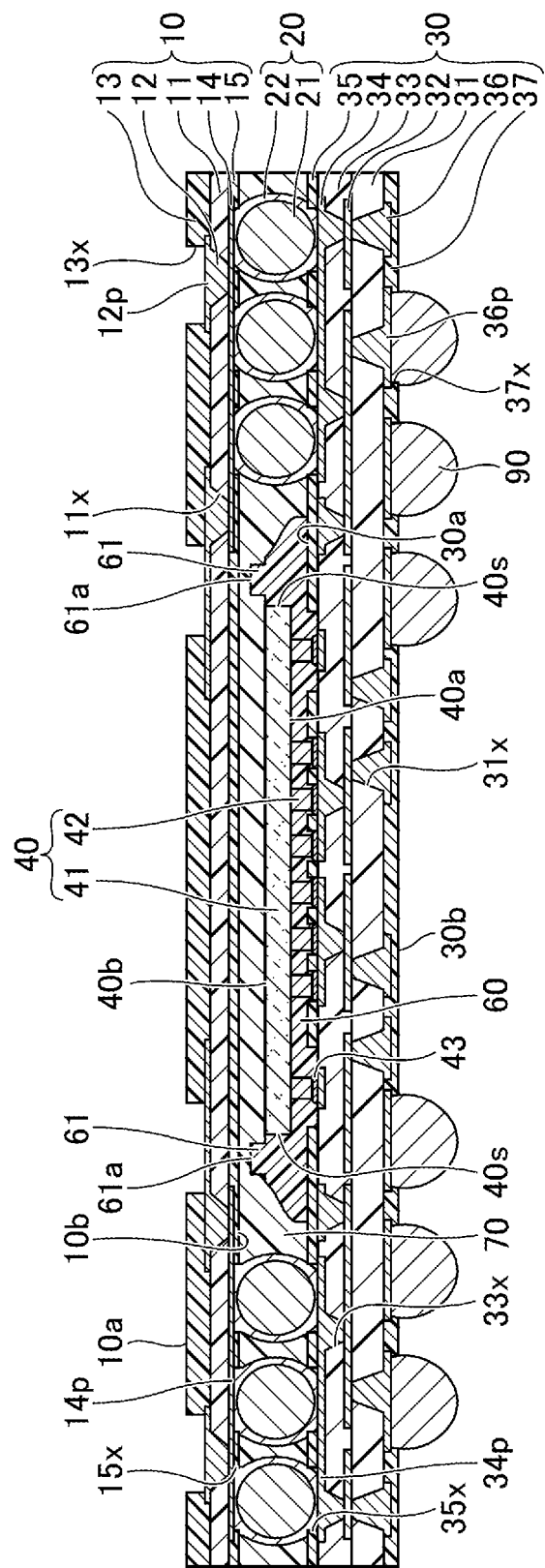
FIG. 10 is a cross sectional view illustrating an example of the embedded PCB according to a first modification of the first embodiment.

When the gap is generated between the top portions 61a of the protrusions 61 and the other surface 10b of the substrate 10, as illustrated in FIG. 10, the gap is filled with the mold resin 70. As a result, the bending of the substrate 10 is relaxed and reduced, and the top portions 61a of the protrusions 61 and the substrate 10 are bonded to each other by the mold resin 70. For this reason, even in the case where the embedded PCB 1 is used under the condition in which the high-temperature environment and the low-temperature environment are repeated, for example, it is possible to prevent the vicinities of the protrusions 61 from becoming the starting points of stripping. FIG. 10 is a cross sectional view illustrating an example of an embedded PCB 1A according to a first modification of the first embodiment.

It is not an essential requirement that the gap between the top portions 61a of the protrusions 61 and the other surface 10b of the substrate 10 is filled with the mold resin 70. For example, depending on the height of the protrusions 61 and the injection pressure of the insulating resin, the gap between the top portions 61a of the protrusions 61 and other surface 10b of the substrate 10 may not be filled with the mold resin 70.

The protrusions 61 having the top portions 61a thereof making contact with the other surface 10b of the substrate 10, and the protrusions 61 having the top portions 61a thereof bonded to the other surface 10b of the substrate 10 via the mold resin 70, may coexist in a single embedded PCB 1.

Second Embodiment

Next, a second embodiment will be described. The second embodiment differs from the first embodiment mainly in the configuration of the substrate bonding member.

[Configuration of Embedded PCB]

Figure 11:
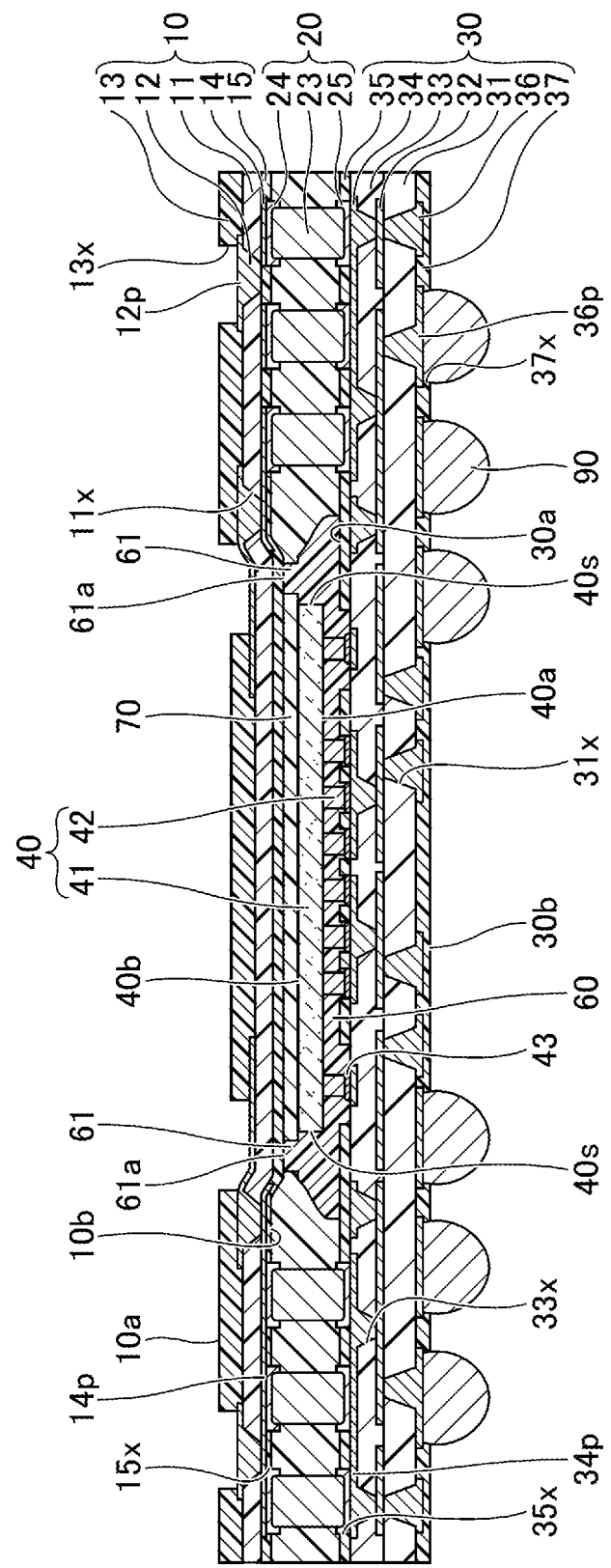
FIG. 11 is a cross sectional view illustrating an example of the embedded PCB according to a second embodiment.

First, the configuration of the embedded PCB will be described. FIG. 11 is a cross sectional view illustrating an example of the embedded PCB according to the second embodiment.

As illustrated in FIG. 11, in an embedded PCB 2 according to the second embodiment, the substrate bonding member 20 includes a metal pillar (or metal post) 23, and conductive materials 24 and 25, in place of the solder ball with the core.

A copper pillar or the like can be used for the metal pillar 23, for example. A material similar to that used for the conductive material 22, can be used for the conductive materials 24 and 25, for example. The conductive material 24 bonds the metal pillars 23 and the pads 14p of the substrate 10. The conductive material 25 bonds the metal pillars 23 and the pads 34p of the substrate 30.

Otherwise, the configuration of the embedded PCB 2 according to the second embodiment is similar to the configuration of the embedded PCB 1 according to the first embodiment.

[Method for Manufacturing Embedded PCB According to Second Embodiment]

Figure 12:
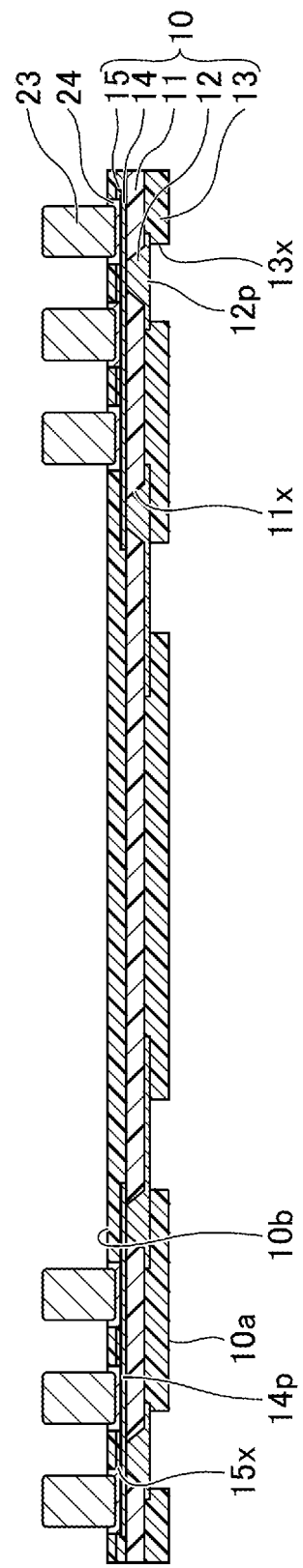
FIG. 12 is a diagram illustrating an example of a manufacturing process of the embedded PCB according to the second embodiment.

Next, a method for manufacturing the embedded PCB according to the second embodiment will be described. FIG. 12 is a diagram illustrating an example of a manufacturing process of the embedded PCB according to the second embodiment.

First, similar to the first embodiment, the substrate 30 is manufactured, and the semiconductor chip 40 is mounted on the substrate 30 (refer to FIG. 3A through FIG. 6A). In addition, similar to the first embodiment, the substrate 10 is manufactured (refer to FIG. 6B). Next, as illustrated in FIG. 12, the metal pillars 23 are bonded to the pads 14p exposed inside the openings 15x of the solder resist layer 15 of the substrate 10, using the conductive material 24.

Next, the substrate 10 provided with the metal pillars 23 is turned upside-down from a state illustrated in FIG. 12, and is laminated on the substrate 30. In this state, the conductive material 25 is interposed between the metal pillars 23 and the pads 34p. Then, the substrate 10 is pressed toward the substrate 30, while heating the conductive material 25. As a result, the substrate 10 and the substrate 30 are electrically connected via the substrate bonding members 20. In addition, a predetermined gap is secured between the substrate 10 and the substrate 30 by the metal pillars 23.

Thereafter, the process of forming the mold resin 70 and the subsequent process are performed, similar to the first embodiment.

Hence, the embedded PCB 2 according to the second embodiment is completed by the processes described above.

According to the second embodiment, effects similar to those obtainable by the first embodiment can be obtained.

Third Embodiment

Figure 13:
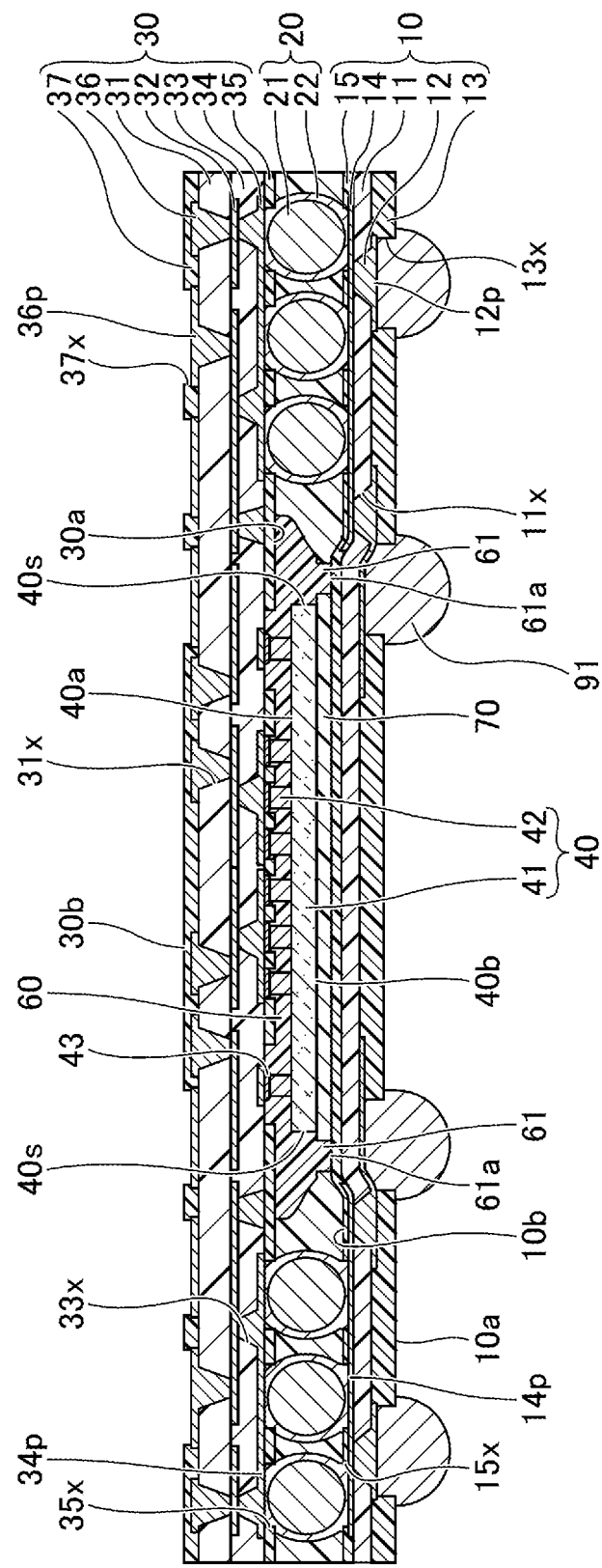
FIG. 13 is a cross sectional view illustrating an example of the embedded PCB according to a third embodiment.

Next, a third embodiment will be described. The third embodiment differs from the first embodiment mainly in the position of the external connection terminal. FIG. 13 is a cross sectional view illustrating an example of the embedded PCB according to the third embodiment.

As illustrated in FIG. 13, an embedded PCB 3 according to the third embodiment includes external connection terminals 91, in place of the external connection terminals 90. The external connection terminals 91 are provided on the one surface of the pads 12p, and protrude upward from the one surface of the solder resist layer 13 through the openings 13x. Each external connection terminal 91 may include a post, and a bump provided thereon. The external connection terminals 91 function as external connection terminals to be electrically connected to a mounting substrate (not illustrated) or the like, such as a motherboard or the like, for example. On the other hand, the pads 36p function as pads to be electrically connected to an electronic component (not illustrated), such as a semiconductor chip, a semiconductor package, or the like.

Otherwise, the configuration of the embedded PCB 3 according to the third embodiment is similar to the configuration of the embedded PCB 1 according to the first embodiment.

According to the third embodiment, effects similar to those obtainable by the first embodiment can be obtained.

Fourth Embodiment

Figure 14:
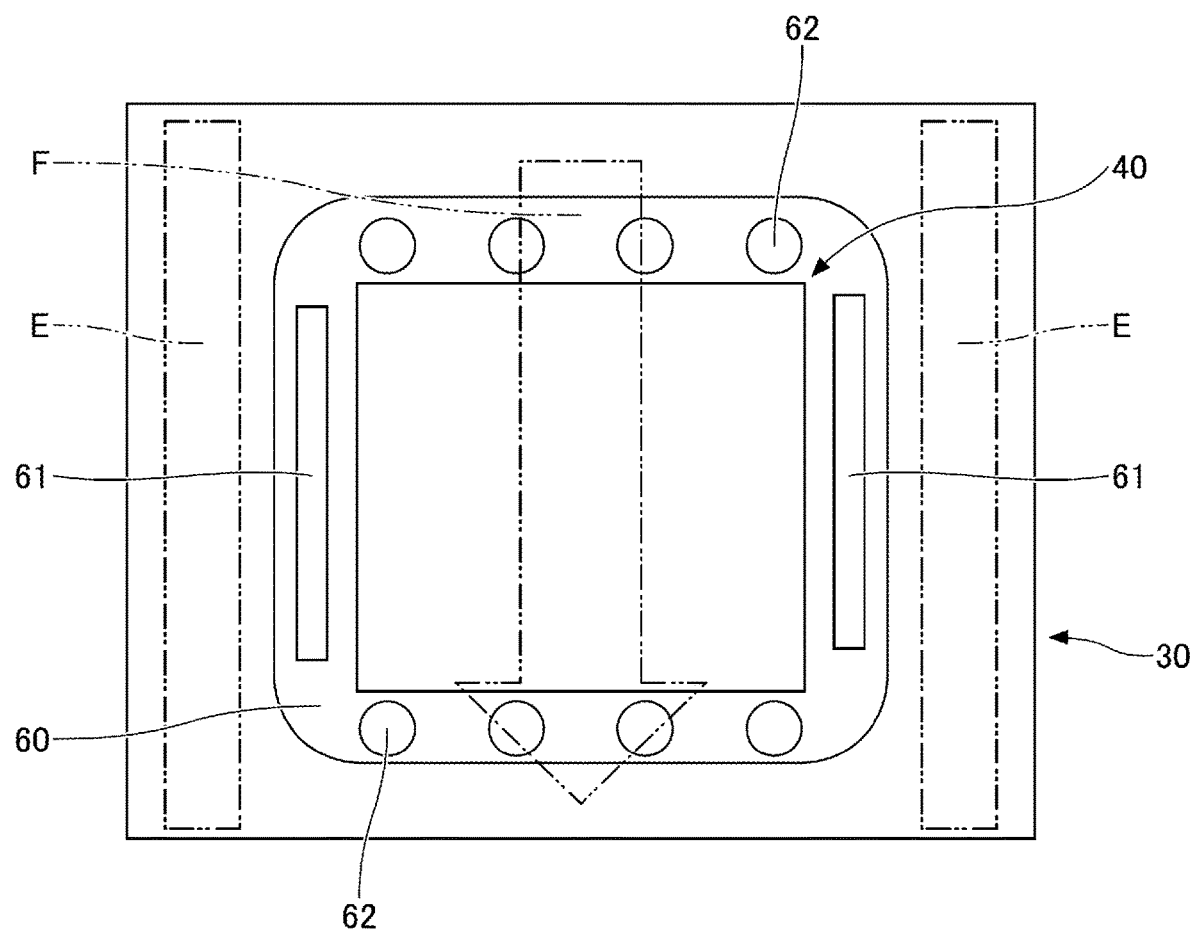
FIG. 14 is a plan view schematically illustrating the arrangement of protrusions in a fourth embodiment.

Next, a fourth embodiment will be described. The fourth embodiment differs from the first embodiment mainly in the arrangement of the protrusions. FIG. 14 is a plan view schematically illustrating the arrangement of protrusions according to the fourth embodiment. FIG. 14 schematically illustrates only some of the constituent elements of the embedded PCB, similar to FIG. 2. FIG. 14 is not drawn to scale with respect to the dimensional relationships of FIG. 1. Further, regions E in FIG. 14 indicate regions where the substrate bonding members 20 are disposed. An arrow F in FIG. 14 indicates an example of a flow direction of the mold resin during manufacturing processes of the embedded PCB.

As illustrated in FIG. 14, in the embedded PCB according to the fourth embodiment, the underfill resin 60 includes protrusions 62 in addition to the protrusions 61. Each protrusion 62 has a top portion located at a position closer to the other surface 10b of the substrate 10 than to the back surface 40b of the semiconductor chip 40, similar to each protrusion 61. A height H (that is, a protruding amount from the back surface 40b of the semiconductor chip 40) of the protrusion 62 may be in a range of approximately 15 μm to approximately 20 μm, for example.

As illustrated in FIG. 14, the protrusions 62 are provided in an island shape on an outer side of side surfaces 40s of the semiconductor chip 40, parallel to each other, and different from the two side surfaces 40s on which the protrusions 61 are provided. A planar shape of the protrusion 62 may be a circular shape, for example. In a case where the semiconductor chip 40 has a square shape with a side of 12 mm, for example, the protrusions 62 having a circular planar shape with a diameter of 1 mm can be disposed at the positions illustrated in FIG. 14. In this case, the surface 81 of the bonding tool 80 is provided with recesses having a circular shape in the plan view, together with the grooves 82. In the case where the planar shape of the protrusions 62 is circular, the shape of the protrusions 62 may be cylindrical or may be a truncated cone shape having a diameter that decreases toward the other surface 10b of the substrate 10. The planar shape of the protrusions 62, the positions where the protrusions 62 are disposed, and the number of the protrusions 62 provided, are not limited to those illustrated in FIG. 14, and can be determined arbitrarily. The planar shape of the protrusions 62 may be a rectangular shape, an elliptical shape, or the like, for example, and the shape of the protrusions 62 may be a prismatic shape, a truncated pyramid shape, an elliptic cylinder shape, an elliptic truncated pyramid shape, or the like, for example. However, the protrusions 62 are preferably disposed at positions so as not to interfere with the flow of the mold resin 70.

Otherwise, the configuration of the embedded PCB according to the fourth embodiment is similar to the configuration of the embedded PCB 1 according to the first embodiment.

According to the fourth embodiment, effects similar to those obtainable by the first embodiment can be obtained. In addition, according to the fourth embodiment, because the underfill resin 60 includes the protrusions 61 and 62, it is possible to more easily secure a gap between the back surface 40b of the semiconductor chip 40 and the other surface 10b of the substrate 10.

Figure 15:
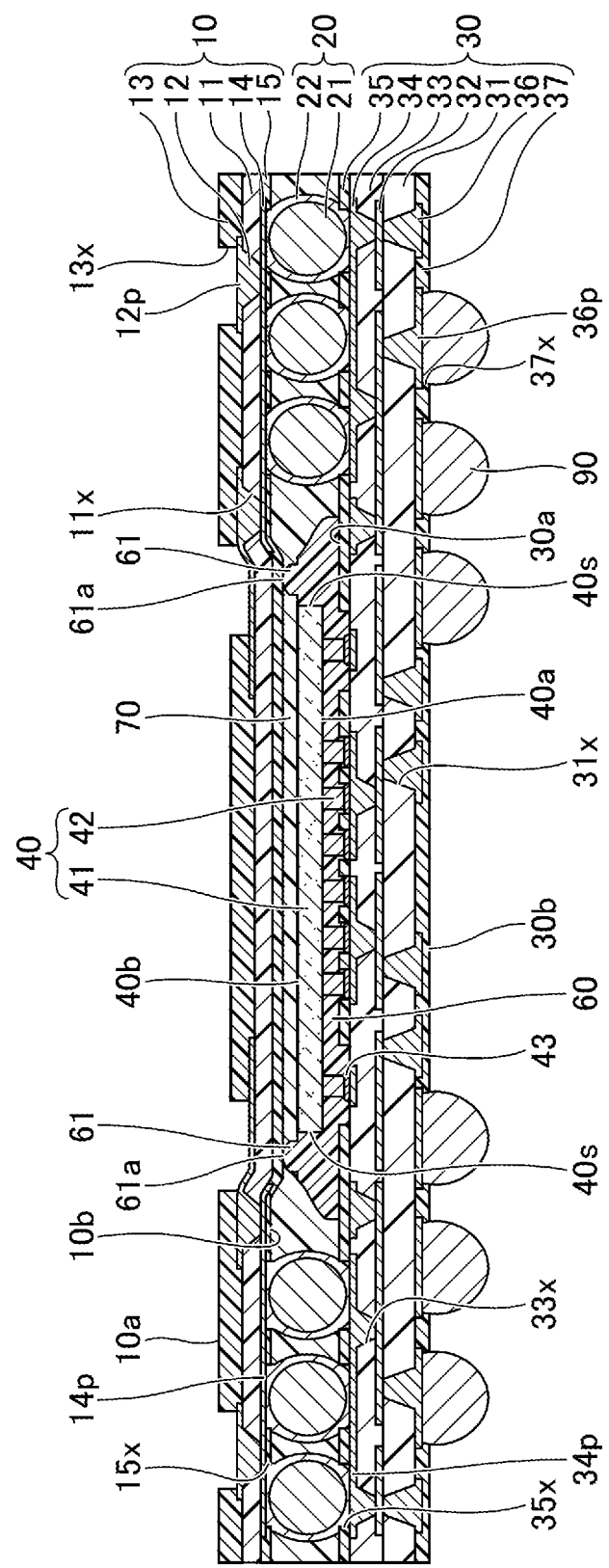
FIG. 15 is a cross sectional view illustrating an example of the embedded PCB according to a second modification of the first embodiment.

Although the top portions 61a of the protrusions 61 have a flat surface in FIG. 1 or the like, the shape of the top portions 61a is not particularly limited. For example, as illustrated in FIG. 15, the top portions 61a of the protrusions 61 may have a curved surface that is convex toward the other surface 10b of the substrate 10. The same applies to the shape of the top portions of the protrusions 62. FIG. 15 is a cross sectional view illustrating an embedded PCB 1B according to a second modification of the first embodiment.

Although preferred embodiments or the like have been described above in detail, the present invention is not limited to the above described embodiments or the like, and various variations, modifications, and substitutions can be made to the embodiments or the like described above, without departing from the scope of the present invention.

For example, a build-up substrate or the like formed with more interconnect layers and insulating layers may be used for the substrate 10 and the substrate 30. In this case, a coreless build-up substrate or the like may be used for the substrate 10 and the substrate 30.

According to the disclosed technique, it is possible to provide an embedded printed circuit board and a method for manufacturing the embedded printed circuit board, which enable a resin to be easily filled between a back surface of a semiconductor chip and a substrate opposing the back surface.

Various aspects of the subject-matter described herein may be set out non-exhaustively in the following numbered clauses:

1. A method for manufacturing an embedded printed circuit board, comprising:
  providing a first resin on a first substrate;
  mounting a semiconductor chip on the first substrate via the first resin;
  providing a second substrate on the first substrate via the semiconductor chip, so that the semiconductor chip is sandwiched between the first substrate and the second substrate; and
  filling a second resin between the first substrate and the second substrate, to encapsulate the semiconductor chip and the first resin,
  wherein the mounting the semiconductor chip includes
    forming a cladding portion covering a side surface of the semiconductor chip in the first resin, and
    forming a protrusion protruding from the cladding portion toward the second substrate.

2. The method for manufacturing the embedded printed circuit board according to clause 1, wherein the mounting the semiconductor chip includes
  pressing the semiconductor chip into the first resin in a state where the semiconductor chip is set at a central portion of a bonding tool under suction, wherein
  a recess is formed at a peripheral edge of the bonding tool, and
  a peripheral edge of the first resin is pressed by the peripheral edge of the bonding tool, and the first resin is pushed into the recess, thereby forming the protrusion and the cladding portion.

Although the embodiments are numbered with, for example, "first," "second," "third," or "fourth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An embedded printed circuit board comprising:
  a first substrate;
  a semiconductor chip mounted on the first substrate;
  a second substrate provided on the first substrate via the semiconductor chip so that the semiconductor chip is sandwiched between the first substrate and the second substrate;
  a first resin filled between the semiconductor chip and the first substrate and having a cladding portion covering a side surface of the semiconductor chip; and
  a second resin filled between the first substrate and the second substrate and encapsulating the semiconductor chip and the first resin, such that the second resin makes contact with a back surface of the semiconductor chip facing the second substrate and a lower surface of the second substrate facing the semiconductor chip,
  wherein:
    the first resin includes a protrusion protruding from the cladding portion toward the second substrate, and
    the protrusion has a top portion located closer to the lower surface of the second substrate than to the back surface of the semiconductor chip.

2. The embedded printed circuit board as claimed in claim 1, wherein;
  a gap is formed between the top portion of the protrusion and the lower surface of the second substrate, and
  the gap is filled with the second resin.

3. The embedded printed circuit board as claimed in claim 1, wherein the top portion of the protrusion makes contact with the lower surface of the second substrate.

4. The embedded printed circuit board as claimed in claim 1, wherein the first resin includes a plurality of protrusions.

5. The embedded printed circuit board as claimed in claim 4, wherein:
  a planar shape of the semiconductor chip in a plan view is a rectangular shape, and
  two protrusions among the plurality of protrusions are provided on an outer side of two side surfaces of the semiconductor chip parallel to each other in the plan view.

6. The embedded printed circuit board as claimed in claim 5, wherein the two protrusions are provided linearly and parallel to the two side surfaces of the semiconductor chip in the plan view.

7. The embedded printed circuit board as claimed in claim 6, wherein at least one other protrusion among the plurality of protrusions is provided in an island shape on an outer side of a side surface of the semiconductor chip different from the two side surfaces of the semiconductor chip.

8. The embedded printed circuit board as claimed in claim 1, further comprising:
  a substrate bonding member, provided between the first substrate and the second substrate, and electrically connecting the first substrate and the second substrate,
  wherein the substrate bonding member is encapsulated by the second resin.

9. The embedded printed circuit board as claimed in claim 1, wherein:
  the first resin is an underfill resin, and
  the second resin is a mold resin.

10. The embedded printed circuit board as claimed in claim 1, wherein a height of the protrusion from one surface of the first substrate, facing a circuit forming surface of the semiconductor chip opposite to the back surface of the semiconductor chip, to the top portion of the protrusion is higher than a height from the one surface of the first substrate to the back surface of the semiconductor chip.

11. The embedded printed circuit board as claimed in claim 2, wherein a height of the protrusion from one surface of the first substrate, facing a circuit forming surface of the semiconductor chip opposite to the back surface of the semiconductor chip, to the top portion of the protrusion is higher than a height from the one surface of the first substrate to the back surface of the semiconductor chip.

12. The embedded printed circuit board as claimed in claim 3, wherein a height of the protrusion from one surface of the first substrate, facing a circuit forming surface of the semiconductor chip opposite to the back surface of the semiconductor chip, to the top portion of the protrusion is higher than a height from the one surface of the first substrate to the back surface of the semiconductor chip.

\* \* \* \* \*